US012740481B2

(12) United States Patent
Lee et al.

(10) Patent No.: US 12,740,481 B2
(45) Date of Patent: Sep. 15, 2026

(54) SEMICONDUCTOR PACKAGE WITH A NON-CONDUCTIVE FILM HAVING A FLUX COMPRISING A DIBENZOCYCLOOCTADIENE (DBCOD)-BASED COMPOUND

(71) Applicant: Samsung Electronics Co., Ltd., Suwon-si (KR)

(72) Inventors: Seonho Lee, Suwon-si (KR); Myoungchul Eum, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 382 days.

(21) Appl. No.: 18/214,124

(22) Filed: Jun. 26, 2023

(65) Prior Publication Data

US 2024/0096839 A1 Mar. 21, 2024

(30) Foreign Application Priority Data

Sep. 7, 2022 (KR) ........................ 10-2022-0113785

(51) Int. Cl.
*H10W 90/00* (2026.01)
*H10W 72/30* (2026.01)
*H10W 74/15* (2026.01)

(52) U.S. Cl.
CPC .......... *H10W 90/00* (2026.01); *H10W 72/354* (2026.01); *H10W 74/15* (2026.01); *H10W 90/722* (2026.01); *H10W 90/732* (2026.01)

(58) Field of Classification Search
CPC ......... H01L 24/32; H01L 24/16; H01L 24/29; H01L 24/73; H01L 24/92; H01L 24/13; H01L 24/17; H01L 24/81; H01L 24/83; H01L 25/0657; H01L 25/18; H01L 25/50; H01L 2224/16145; H01L 2224/2919; H01L 2224/32145; H01L 2224/73204; H01L 21/563; H01L 23/293; H01L 23/3171; H01L 23/3128; H01L 23/3185;
(Continued)

(56) References Cited

U.S. PATENT DOCUMENTS 8,773,583 B2 7/2014 Wakiyama et al.
8,836,140 B2 9/2014 Ma et al.
(Continued)

FOREIGN PATENT DOCUMENTS

JP 2019-189764 A 10/2019
KR 10-1462845 B1 11/2014
(Continued)

OTHER PUBLICATIONS

Communication issued Jul. 9, 2025 by the Taiwan Intellectual Property Office in counterpart Taiwanese Patent Application No. 112131200.

(Continued)

*Primary Examiner* — Wael M Fahmy
*Assistant Examiner* — Tiberiu Dan Onuta
(74) *Attorney, Agent, or Firm* — Sughrue Mion, PLLC

(57) ABSTRACT

A semiconductor package includes a buffer die, a first core die disposed on the buffer die, and a non-conductive film (NCF) disposed between the buffer die and the first core die so that the buffer die and the first core die are bonded to each other, wherein the NCF includes a dibenzocyclooctadiene (DBCOD)-based compound.

12 Claims, 22 Drawing Sheets

(58) Field of Classification Search
CPC . H01L 23/31; H01L 23/488; H01L 23/49894; H01L 2225/06562; H01L 2225/06582; H01L 2225/06513; H01L 2225/06517; H01L 2225/06541; H01L 2225/06586; H01L 24/31; C08K 5/01; C08K 5/1515; C08L 63/00
See application file for complete search history.

(56) References Cited

U.S. PATENT DOCUMENTS

| | | | | |
|---|---|---|---|---|
| 9,793,485 | B2 | 10/2017 | Zhu et al. | |
| 11,256,029 | B2 | 2/2022 | Kannan et al. | |
| 11,362,070 | B2 | 6/2022 | Limaye et al. | |
| 11,621,245 | B2 | 4/2023 | Ko et al. | |
| 2010/0206623 | A1 | 8/2010 | Kawate et al. | |
| 2013/0309817 | A1 | 11/2013 | Tseng et al. | |
| 2017/0025378 | A1 | 1/2017 | Yu | |
| 2019/0221520 | A1* | 7/2019 | Kim | H10W 70/611 |
| 2019/0273044 | A1 | 9/2019 | Fu et al. | |
| 2021/0102066 | A1 | 4/2021 | Lu et al. | |
| 2021/0217707 | A1 | 7/2021 | Tsai et al. | |
| 2021/0387987 | A1 | 12/2021 | Redline et al. | |
| 2022/0037258 | A1 | 2/2022 | Arifeen | |
| 2023/0250099 | A1* | 8/2023 | Redline | C07C 211/60 524/190 |

FOREIGN PATENT DOCUMENTS

| | | | | |
|---|---|---|---|---|
| KR | 10-2016-0023481 A | 3/2016 | | |
| TW | 201834191 A | 9/2018 | | |
| TW | 202017123 A | 5/2020 | | |
| TW | 202127605 A | 7/2021 | | |
| TW | 202129876 A | 8/2021 | | |
| TW | 202201709 A | 1/2022 | | |
| TW | 202221869 A | 6/2022 | | |
| WO | WO-2019195442 A1 * | 10/2019 | | C08K 3/041 |

OTHER PUBLICATIONS

Michael Leveille et al., “Directional, Low-Energy Driven Thermal Actuating Bilayer Enabled by Coordinated Submolecular Switching”, Advanced Science, 2021, vol. 8, Issue No. 23, 11 total pages, DOI: 10.1002/advs.202102077.

Zhao Wang et al., “Design and Synthesis of Thermal Contracting Polymer with Unique Eight-Membered Carbocycle Unit”, Macromolecules, 2018, vol. 51, Issue No. 4, 10 total pages, DOI: 10.1021/acs.macromol.7b02705.

Communication dated Feb. 2, 2026 issued by the Korean Ministry of Intellectual Property in Korean Patent Application No. 10-2022-0113785.

* cited by examiner 40
10
200
202
300
302
400
201
126
521
301
401
Z
Y
X

SEMICONDUCTOR PACKAGE WITH A NON-CONDUCTIVE FILM HAVING A FLUX COMPRISING A DIBENZOCYCLOOCTADIENE (DBCOD)-BASED COMPOUND

CROSS-REFERENCE TO RELATED APPLICATION

This application is based on and claims priority to Korean Patent Application No. 10-2022-0113785, filed on Sep. 7, 2022, in the Korean Intellectual Property Office, the disclosure of which is incorporated by reference herein in its entirety.

BACKGROUND

The present disclosure relates to a semiconductor package. More specifically, the technical aspect of the present disclosure relates to a semiconductor package manufactured through a thermocompression process using a non-conductive film (NCF).

Over the past few decades, the discovery of technologies, materials, and manufacturing processes has led to rapid advances in computing power and wireless communication technologies. As a result, the direct implementation of high-performance transistors has become possible, and the rate of integration doubled approximately every 18 months according to Moore's Law. Lightweight, compact, and power efficient systems are the permanent goals of the semiconductor manufacturing industry, but at this time, economic and physical process limits are being reached, so a 3D integrated packaging is being proposed as an effective solution.

SUMMARY

The present disclosure provides a semiconductor package having improved reliability and performance.

The problems to be solved by the technical spirit of the present disclosure are not limited to the problems mentioned above, and other problems not mentioned will be clearly understood by those skilled in the art from the following description.

A semiconductor package according to an aspect of the present disclosure is provided. According to an aspect of the present disclosure, there is provided a semiconductor package including a buffer die, a first core die disposed on the buffer die, and a non-conductive film (NCF) disposed between the buffer die and the first core die so that the buffer die and the first core die are bonded to each other, wherein the NCF includes a dibenzocyclooctadiene (DBCOD)-based compound. A dibenzocyclooctadiene (DBCOD)-based compound can be dibenzocyclooctadiene or a compound which can be formed from dibenzocyclooctadiene, such as a substituted dibenzocyclooctadiene.

A semiconductor package according to another aspect of the present disclosure is provided. According to another aspect of the present disclosure, there is provided a semiconductor package including a buffer die, a first core die disposed on the buffer die; and a non-conductive film (NCF) surrounding the first core die so that the buffer die and the first core die are bonded to each other, wherein the NCF includes a DBCOD-based compound.

A semiconductor package according to another aspect of the present disclosure is provided. According to another aspect of the present disclosure, there is provided a semiconductor package including a buffer die, a buffer upper pad disposed on an upper surface of the buffer die, a first core die disposed on the buffer die, a core lower pad disposed on a lower surface of the first core die, a core lower solder attached to the core lower pad, and a non-conductive film (NCF) disposed between the buffer die and the first core die so that the buffer die and the first core die are bonded to each other and surrounding the core lower solder, wherein the core lower solder is disposed on the buffer upper pad and in contact with the buffer upper pad, and the NCF includes a DBCOD-based compound.

A semiconductor package according to another aspect of the present disclosure is provided. According to another aspect of the present disclosure, there is provided a semiconductor package including a first die, and a die attach film (DAF) adhered to a lower surface of the first die, wherein the DAF is configured to bond the first die to a second die or semiconductor substrate, and the DAF includes a DBCOD-based compound.

A semiconductor package according to another aspect of the present disclosure is provided. According to another aspect of the present disclosure, there is provided a semiconductor package including a substrate, and a first die disposed on the substrate, wherein the substrate includes a redistribution insulating layer and a redistribution pattern, the redistribution insulating layer includes at least one selected from Ajinomoto buildup film (ABF) and photo imageable dielectric (PID), and the at least one selected from the ABF and the PID includes a dibenzocyclooctadiene (DBCOD)-based compound.

BRIEF DESCRIPTION OF DRAWINGS

Embodiments will be more clearly understood from the following detailed description taken in conjunction with the accompanying drawings in which.

DETAILED DESCRIPTION OF EMBODIMENTS

Figure 1:
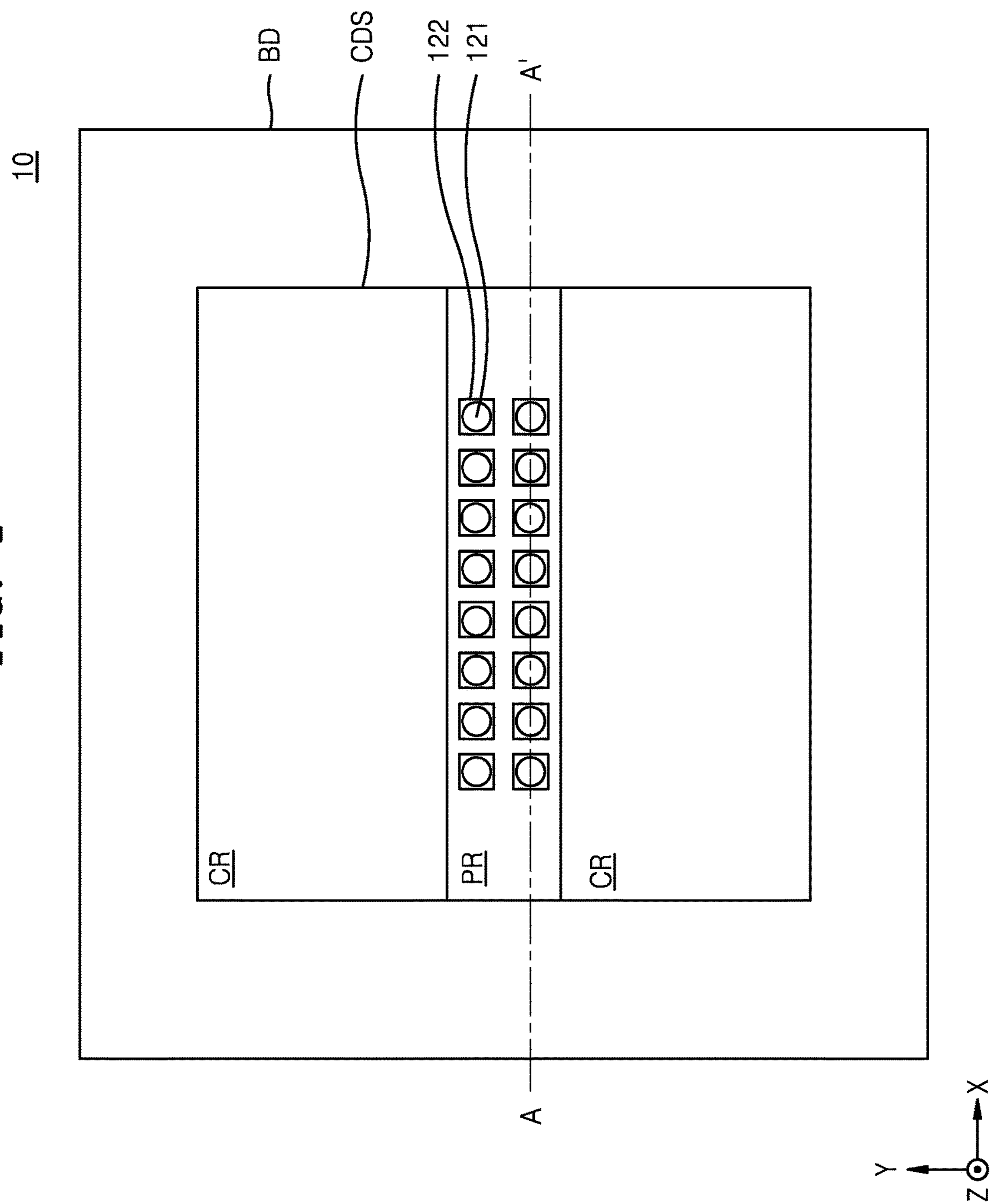
FIG. 1 is a diagram illustrating a layout of a semiconductor package according to some embodiments of the present disclosure.

Hereinafter, embodiments of the present disclosure will be described in detail with reference to the accompanying drawings. Like reference numerals are used to indicate same components in the drawings, and the descriptions thereof are omitted. In the drawings, thickness or size of each layer may be exaggerated for convenience and clarity of description, and thus, may be slightly different from an actual shape and ratio.

Figure 2A:
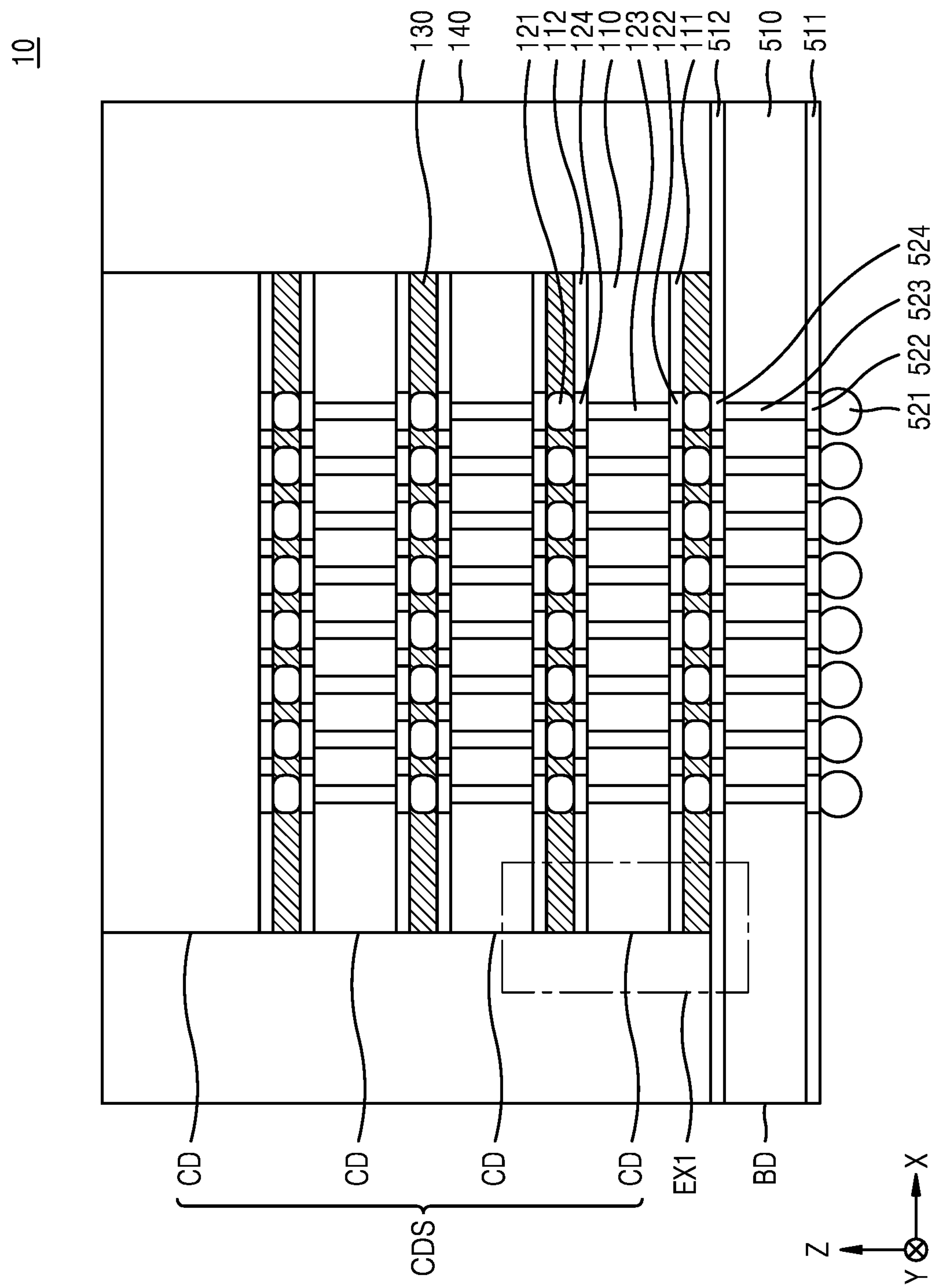
FIG. 2A is a cross-sectional view taken along line A-A' of FIG. 1.
Figure 2B:
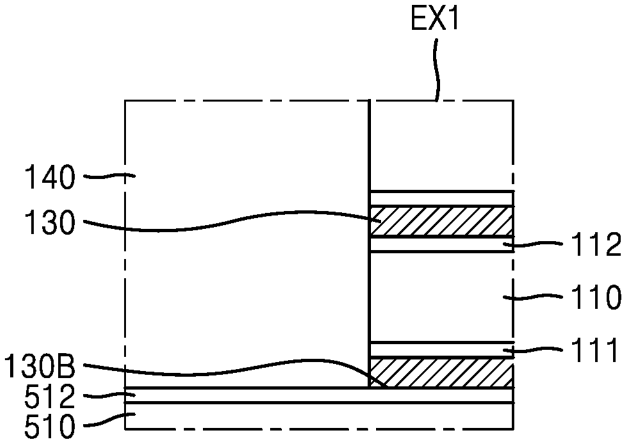
FIG. 2B is an enlarged cross-sectional view of a part EX1 of FIG. 2A.

FIG. 1 is a layout diagram illustrating a semiconductor package 10 according to some embodiments of the present disclosure. FIG. 2A is a cross-sectional view taken along line A-A' of FIG. 1. FIG. 2B is an enlarged cross-sectional view illustrating part EX1 of FIG. 2.

Referring to FIGS. 1, 2A, and 2B, the semiconductor package 10 may include a buffer die BD, a core die stack CDS, a non-conductive film (NCF) 130, and a molding layer 140. According to some embodiments, the semiconductor package 10 illustrated in FIGS. 1, 2A, and 2B may be a high bandwidth memory (HBM) including a plurality of DRAM chips and a logic chip.

The semiconductor package 10 may include a circuit region CR in which a circuit is formed and a pad region PR for electrical connection between stacked core dies CD. In FIG. 1, although it is depicted that the two circuit regions CR are spaced apart from each other with the pad region PR therebetween, this is only an example and does not limit the technical spirit of the present disclosure in any way.

The pad region PR may be a region in which a plurality of through electrodes 123 and 523, a plurality of pads 122, 124, 522, and 524, and a plurality of solders 121 and 521 are disposed.

The plurality of through electrodes 123 and 523, the plurality of pads 122, 124, 522, and 524, and the plurality of solders 121 and 521 may be arranged in various layouts in a first horizontal direction (X direction) and a second horizontal direction (Y direction) in the pad region PR. According to some embodiments, as illustrated in FIGS. 1 and 2A, the plurality of pads 122, 124, 522, and 524 and the plurality of solders 121 and 521 may form a matrix with a pitch in the pad region PR in the first horizontal direction (X direction) and the second horizontal direction (Y direction). Although not shown in FIG. 1, the plurality of through electrodes 123 and 523 may have the same arrangement. Referring to FIG. 1, when viewed from above, a planar shape of the plurality of core lower solders 121 is illustrated as a substantially circular shape, but is not limited thereto. For example, the planar shape of the core lower solder 121 may be a quadrangle shape.

In addition, for convenience of illustration, in FIG. 1 with reference to FIG. 2A, it is depicted that eight through electrodes, for example, eight core through electrodes 123, are disposed in the first horizontal direction (X direction) and two core through electrodes 123 are disposed in the horizontal direction (Y direction) in the pad region PR, but the number and arrangement of the core through electrodes 123 are not limited to those illustrated in FIG. 1 with reference to FIG. 2A.

In some embodiments, the buffer die BD may be a logic chip. Herein, the logic chip may be one of a gate array, a cell base array, an embedded array, a structured application-specific integrated circuit (ASIC), a field programmable gate array (FPGA), a complex programmable logic device (CPLD), a central processing unit (CPU), a micro processing unit (MPU), a micro controller unit (MCU), a logic IC, an application processor (AP), a driver driving IC, an RF chip, and a CMOS image sensor. However, the present disclosure is not limited thereto, and the buffer die BD may be a memory chip.

The buffer die BD may include a buffer substrate 510, a buffer lower insulating layer 511, a plurality of buffer lower solders 521, a plurality of buffer lower pads 522, a buffer upper insulating film 512, a plurality of buffer upper pads 524, and a plurality of buffer through electrodes 523.

In some embodiments, the buffer substrate 510 may include silicon (Si). Alternatively, the buffer substrate 510 may include a semiconductor element, such as germanium (Ge), or a compound semiconductor, such as silicon carbide (SiC), gallium arsenide (GaAs), indium arsenide (InAs), and indium phosphide (InP). Alternatively, the buffer substrate 510 may have a silicon on insulator (SOI) structure. For example, the buffer substrate 510 may include a buried oxide layer (BOX). The buffer substrate 510 may include a conductive region, for example, a well doped with an impurity or a structure doped with an impurity. Also, the buffer substrate 510 may have various device isolation structures, such as a shallow trench isolation (STI) structure.

In some embodiments, the buffer substrate 510 may include a plurality of individual devices of various types and an interlayer insulating layer. The plurality of individual devices may include various microelectronic devices, for example, a metal-oxide-semiconductor field effect transistor (MOSFET), such as a complementary metal-oxide-semiconductor (CMOS) transistor, a system large scale integration (LSI), a flash memory, dynamic random access memory (DRAM), static random access memory (SRAM), electrically erasable programmable read-only memory (EEPROM), phase-change random access memory (PRAM), magnetic random access memory (MRAM), or ferroelectric random access memory (FeRAM), an image sensor, such as a CMOS imaging sensor (CIS), a micro-electro-mechanical system (MEMS), an active device, a passive device, and the like. The plurality of individual devices may be formed in the buffer substrate 510 in the cell region CR, and the plurality of individual devices may be electrically connected to the conductive region of the buffer substrate 510. The buffer substrate 510 may further include at least two of the plurality of individual devices, or a conductive wire or a conductive plug electrically connecting the plurality of individual devices to the conductive region of the buffer substrate 510. Also, each of the plurality of individual devices may be electrically isolated from other adjacent individual devices by insulating layers.

In some embodiments, the buffer substrate 510 may be formed to include a plurality of wiring structures for connecting the plurality of individual devices to other wirings formed on the buffer substrate 510. The plurality of wiring structures may include a metal wiring pattern extending in a horizontal direction and a via plug extending in a vertical direction. The metal wiring pattern and the via plug may include a barrier film and a conductive layer. The barrier film for wiring may include at least one material selected from titanium (Ti), titanium nitride (TiN), tantalum (Ta), and tantalum nitride (TaN). The conductive layer may include at least one metal selected from tungsten (W), aluminum (Al), and copper (Cu). The plurality of wiring structures may have a multilayer structure in which two or more metal wiring patterns and two or more via plugs are alternately stacked. According to some embodiments, the buffer lower pad 522 and the buffer upper pad 524 may also include at least one metal selected from tungsten (W), aluminum (Al), and copper (Cu).

In some embodiments, the buffer substrate 510 may have a lower surface and an upper surface facing each other, the buffer lower insulating layer 511 may be disposed on the lower surface of the buffer substrate 510, and the buffer upper insulating layer 512 may be disposed on the upper surface of the buffer substrate 510. In the present specification, the lower surface and the upper surface of the buffer substrate 510 may denote a plane perpendicular to a direction in which a substrate is stacked (i.e., a vertical direction, also referred to as a Z-direction), and in particular, the lower surface denotes a surface of a lower vertical level, and the upper surface denotes a surface of an upper vertical level. The buffer lower insulating layer 511 and the buffer upper insulating layer 512 may be protective layers for protecting the buffer substrate 510 and the wiring structure formed therein from external impact or moisture. In some embodiments, the buffer lower insulating layer 511 and the buffer upper insulating layer 512 may include at least one of silicon nitride, silicon oxide, and silicon oxynitride.

In some embodiments, the buffer lower solder 521 and the buffer lower pad 522 may be disposed on the lower surface of the buffer substrate 510. The buffer lower solder 521 and the buffer lower pad 522 may form a stack structure. A side surface of the buffer lower pad 522 may be covered by the buffer lower insulating layer 511. One surface of the buffer lower pad 522 may be coplanar with the upper surface of the buffer lower insulating layer 511 and be exposed to the outside.

In some embodiments, the buffer lower solder 521 may be disposed on the buffer lower pad 522 and electrically connect the buffer die BD to an external device. The buffer lower solder 521 may be disposed on the buffer substrate 510 and may be in contact with the buffer lower pad 522. The buffer lower solder 521 may include at least one of tin (Sn) titanium (Ti), vanadium (V), antimony (Sb), lead (Pb), tungsten (W), chromium (Cr), copper (Cu), nickel (Ni), aluminum (Al), palladium (Pd), silver (Ag), and gold (Au).

In some embodiments, the buffer lower solder 521 may be a single metal layer or a stack structure of a plurality of metal layers. For example, the buffer lower solder 521 may include a first metal layer, a second metal layer, and a third metal layer that are sequentially stacked. The first metal layer may include a material having high adhesiveness to the buffer lower pad 522 and the buffer lower insulating layer 511. That is, the first metal layer may be an adhesive layer for improving the stability of the formation of the buffer lower solder 521. The first metal layer may include, for example, at least one of titanium (Ti), titanium-tungsten (Ti—W), chromium (Cr), and aluminum (Al). The second metal layer may be a barrier film that prevents the metal material included in the buffer lower solder 521 from diffusing into the buffer substrate 510. The second metal layer may include at least one of copper (Cu), nickel (Ni), chromium-copper (Cr—Cu), and nickel vanadium (Ni—V). The third metal layer may act as a seed layer for forming the buffer lower solder 521 or a wetting layer for improving wetting characteristics of the buffer lower solder 521. The third metal layer may include at least one of nickel (Ni), copper (Cu), and aluminum (Al).

The buffer lower solder 521 may form the lowermost surface of the semiconductor package 10. In some embodiments, the buffer lower solder 521 may be a chip-substrate connection solder for mounting the semiconductor package 10 on an external substrate or an interposer.

The buffer lower solder 521 may include a solder material. The buffer lower solder 521 may include tin (Sn), indium (In), bismuth (Bi), antimony (Sb), copper (Cu), silver (Ag), zinc (Zn), lead (Pb) and/or an alloy thereof. For example, the buffer lower solder 521 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like.

In some embodiments, a plurality of buffer upper pads 524 may be disposed on the upper surface of the buffer substrate 510. A side surface of the buffer upper pad 524 may be covered by the buffer upper insulating layer 512. One surface of the buffer upper pad 524 may be coplanar with the upper surface of the buffer upper insulating layer. The core lower solder 121 may be disposed on the buffer upper pad 524 to electrically connect the buffer die BD to the core die stack CDS.

In some embodiments, a buffer through electrode 523 penetrating through the buffer substrate 510 and configured to be electrically connected to the buffer lower solder 521, the buffer lower pad 522, and the buffer upper pad 524 may be disposed in the buffer substrate 510. The buffer through electrode 523 may penetrate the buffer substrate 510 in a vertical direction (Z direction). The buffer through electrode 523 may electrically connect the buffer upper pad 524 to the buffer lower solder 521 and the buffer lower pad 522 to electrically connect the core die stack CDS to an external device.

In some embodiments, the buffer through electrode 523 may have a column shape. The buffer through electrode 523 may include a barrier film defining a columnar surface and a buried conductive layer filling an inside of the barrier film. The barrier film may include at least one of, for example, titanium (Ti), titanium nitride (TiN), tantalum (Ta), or tantalum nitride (TaN), ruthenium (Ru), cobalt (Co), manganese (Mn), tungsten nitride (WN), nickel (Ni), and nickel boride (NiB), and the buried conductive layer may include at least one of Cu, a Cu alloy, such as Cu, CuSn, CuMg, CuNi, CuZn, CuPd, CuAu, CuRe, and CuW, W, an alloy of W, Ni, Ru, and Co. In some embodiments, the buffer through electrode 523 may further include a through-via insulating layer formed on the same level as the buffer substrate 510 and covering the barrier film. The through-via insulating layer may include an oxide layer, a nitride layer, a carbide layer, a polymer, or a combination thereof.

In some embodiments, each of the plurality of core dies CD may be, for example, a memory semiconductor chip. The memory semiconductor chip may be, for example, a volatile memory semiconductor chip, such as DRAM or SRAM, or a non-volatile memory semiconductor chip, such as PRAM, MRAM, FeRAM, or resistive random access memory (ReRAM). According to some embodiments, each of the plurality of core dies CDs may be a DRAM semiconductor chip for configuring an HBM.

In FIG. 2A, although the semiconductor package 10 in which four core dies CDs are stacked is illustrated as an example, the number of semiconductor chips stacked in the semiconductor package 10 is not limited thereto. For example, 2 to 32 semiconductor chips may be stacked in the semiconductor package 10.

In some embodiments, the core die CD may be disposed on the buffer die BD. The core die CD may include a core substrate 110, a core lower insulating film 111, a core lower solder 121, a core lower pad 122, a core upper insulating film 112, a core upper pad 124, and a core through electrode 123.

In some embodiments, the core substrate 110 may include silicon (Si). Alternatively, the core substrate 110 may include a semiconductor element, such as germanium (Ge), or a compound semiconductor, such as silicon carbide (SiC), gallium arsenide (GaAs), indium arsenide (InAs), and indium phosphide (InP). Alternatively, the core substrate 110 may have an SOI structure. In addition, the core die CD may have various device isolation structures, such as an STI structure.

In some embodiments, the core substrate 110 may have a lower surface and an upper surface facing each other, the core lower insulating film 111 may be disposed on the lower surface of the core substrate 110, and the core upper insulating film 112 may be disposed on the upper surface of the core substrate 110. The core lower insulating film 111 and the core upper insulating film 112 may be protective films for protecting the core substrate 110 and a wiring structure formed therein from external impact or moisture.

In some embodiments, the core lower solder 121 and the core lower pad 122 may be disposed on the lower surface of the core substrate 110. The core lower solder 121 and the core lower pad 122 may form a stacked structure. A side surface of the core lower pad 122 may be covered by the core lower insulating film 111. One surface of the core lower pad 122 may be coplanar with the upper surface of the core lower insulating film 111. A core lower solder 121 may be disposed on the core lower pad 122 to electrically connect the core die CD to the buffer die BD. The core lower solder 121 may be disposed on the buffer upper pad 524 of the buffer die BD to electrically connect the core die CD to the buffer die BD. The core lower solder 121 is disposed between the buffer die BD and the core die CD, and may include a connection terminal configured to electrically connect the buffer die BD to the core die CD.

In some embodiments, a core upper pad 124 may be disposed on the upper surface of the core substrate 110. A side surface of the core upper pad 124 may be covered by the core upper insulating film 112. One surface of the core upper pad 124 may be coplanar with the upper surface of the core upper insulating film 112. The core lower solder 121 may be disposed on the core upper pad 124 to electrically connect the plurality of core dies CDs.

In some embodiments, a core through electrode 123 penetrating through the core substrate 110 and configured to be electrically connected to the core lower solder 121, the core lower pad 122, and the upper core pad 124 may be disposed in the core substrate 110 The core through electrode 123 may penetrate the core substrate 110 in a vertical direction (Z direction). The core through electrode 123 may electrically connect the core upper pad 124 to the core lower solder 121 and the core lower pad 122, thereby electrically connecting the core die CD to the buffer die BD and/or an external device.

In some embodiments, the core lower solder 121 may receive at least one of a control signal for operation of the plurality of core dies CDs, a power supply potential, and a ground potential from the buffer die BD and/or an external device, may receive a data signal to be stored in the plurality of core dies CDs from the buffer die BD and/or an external device, and may configure a path for providing data stored in the plurality of core dies CDs to the buffer die BD and/or an external device.

In some embodiments, the plurality of core dies CDs stacked on the buffer die BD may be substantially the same except for the core die CD disposed uppermost. The core die CD disposed uppermost may include the core substrate 110, the core lower insulating film 111, the core lower solder 121, and the core lower pad 122. An upper insulating layer, an upper pad, and a through electrode may be omitted in the core die CD disposed uppermost. Except for omitting the upper insulating layer, the upper pad, and the through electrode, the core die CD disposed uppermost has similar technical characteristics to the core die CD disposed therebelow, and thus, the detailed descriptions thereof are omitted.

Except for the core lower solder 121 disposed at the lowermost of the core substrate 110, the core lower solder 121 may be disposed between the core upper pad 124 of a lower core die CD and the core lower pad 122 of an upper core die CD. The core lower solder 121 may contact each of the core upper pad 124 and the core lower pad 122. Accordingly, the plurality of core dies CD are configured to be electrically connected to each other.

In some embodiments, the semiconductor package 10 may include an NCF 130 that bonds the core die stack CDS. Specifically, the NCF 130 that bonds the plurality of core dies CDs to each other may be disposed between the plurality of core dies CDs. In some embodiments, the NCF 130 disposed between the two core dies CDs may extend in a horizontal direction, that is, in a first horizontal direction (X direction) and a second horizontal direction (Y direction). In some embodiments, the core lower solder 121 may be disposed on a lower surface of the core die CD, and the NCF 130 surrounds the core lower solder 121 and is disposed between the plurality of core dies CDs. In some embodiments, the NCF 130 may fill between the core lower solders 121.

The NCF 130 may be an adhesive film for bonding the plurality of core dies CDs to each other. The NCF 130 may include an insulating material. The plurality of core dies CDs may be bonded by a thermocompression process using the NCF 130, which will be described later. The NCF 130 may include, for example, an epoxy, a hardener, a polymer, a flux, and/or a filler. The NCF 130 may include dibenzocyclooctadiene (DBCOD).

In some embodiments, the NCF 130 may include a dibenzocyclooctadiene (DBCOD)-based compound having Formula A1 below.

<Formula A1>

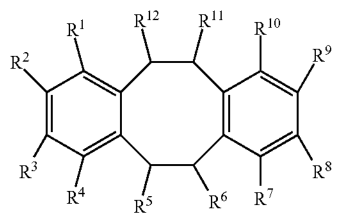

In Formula A1, $R^1$ to $R^{12}$ may be various functional groups including hydrogen, an alkyl group, a carboxyl group, an amine group, an imidazole group, and a phenyl group, or a combination thereof, respectively.

For example, the NCF 130 may include a dibenzocyclooctadiene (DBCOD)-based compound having the following Chemical Formulas A2, A3, and A4.

<Formula A2>

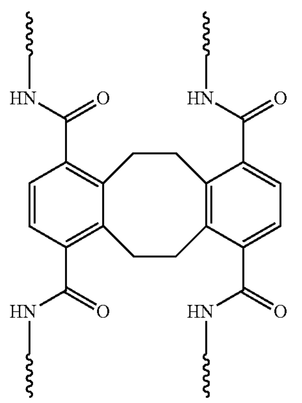

<Formula A3>

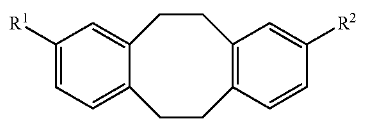

<Formula A4>

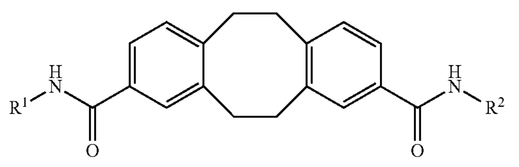

In Formulas A3 and A4, $R^1$ and $R^2$ are as defined above.

In some embodiments, the DBCOD-based compound may include at least one of a cis-diaminedibenzocyclooctadiene (Cis-DADBCOD)-based compound and a trans-DADBCOD-based compound. That is, the DBCOD-based compound may include a cis-type (cis-) bonded to the same side and/or a trans-type (trans-) bonded to the other side when a functional group is bonded to DBCOD. In some embodiments, the DBCOD-based compound may be a mixture of a cis-DADBCOD)-based compound and a trans-DADBCOD-based compound.

In some embodiments, dibenzocyclooctadiene (DBCOD) may be included in the NCF 130 as part of an epoxy, a curing agent, a polymer, a flux, and/or a filler that are components of the NCF 130. That is, the epoxy, the curing agent, the polymer, the flux and/or the filler may include a DBCOD-based compound.

For example, the NCF 130 may include an epoxy. In some embodiments, DBCOD may be included in the NCF 130 as part of an epoxy. Specifically, DBCOD may be included in the NCF 130 by chemically bonding with an epoxy group. For example, the NCF 130 including DBCOD may include an epoxy having Formula A5 below.

<Formula A5>

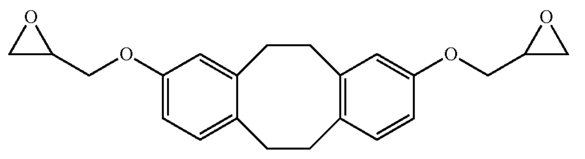

For example, the NCF 130 may include a curing agent. In some embodiments, DBCOD may be included in the NCF 130 as a part of a curing agent. Specifically, the NCF 130 including DBCOD may include a curing agent having Formula A6 below. For example, the curing agent having the following Formula A6 may include the Formulas A7 and/or A8.

<Formula A6>

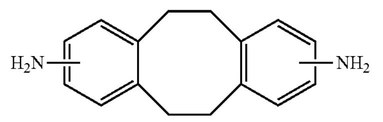

<Formula A7>

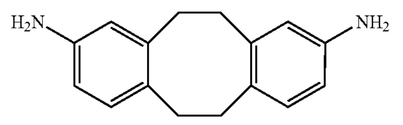

<Formula A8>

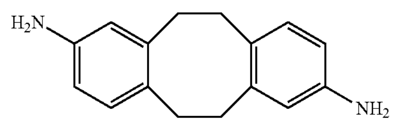

In some embodiments, DBCOD may have a weight ratio of about 0.1 wt % to about 10 wt % of the curing agent. That is, the weight of the DBCOD based on the weight of the curing agent, which is a DBCOD-based compound, may be in a range from about 0.1% to about 10%. For example, the weight ratio of DBCOD may be about 5 wt % of the curing agent, which is a DBCOD-based compound.

For example, the NCF 130 may include a polymer. In some embodiments, DBCOD may be included in the NCF 130 as part of the polymer.

In some embodiments, the weight ratio of DBCOD may be in a range from about 0.1 wt % to about 50 wt % of the polymer. Alternatively, in some embodiments, about 0.1% to about 50% of the molecular weight of the polymer may be occupied by DBCOD.

In some embodiments, in the case of the NCF 130 including a polymer that is a DBCOD-based compound, the polymer may be included in a weight ratio in a range of about 1 wt % to about 50 wt % of the NCF 130.

For example, the NCF 130 may include a flux. In some embodiments, DBCOD may be included in the NCF 130 as part of the flux.

In some embodiments, the weight of DBCOD relative to the weight of the flux, which is a DBCOD-based compound, may be in a range from about 0.1% to about 10%. For example, a weight ratio of DBCOD may be about 5 wt % of the flux, which is a DBCOD-based compound.

The NCF 130 including DBCOD will be described below with reference to FIGS. 2B, 3A, 3B and 4.

As shown in FIG. 2B, the NCF 130 that bonds the core die CD located at the lowermost of the core die stack CDS and the buffer die BD may include a portion in contact with an upper surface of the buffer die BD. That is, a lower surface 130B of the NCF 130 may contact the buffer die BD. In some embodiments, a middle portion of the NCF 130, that is, a portion spaced apart from the molding layer 140, may contact the upper surface of the buffer die BD. In some embodiments, an edge portion of the NCF 130, that is, a portion adjacent to and in contact with the molding layer 140, may contact the upper surface of the buffer die BD. In some embodiments, an edge portion of the NCF 130, that is, a portion adjacent to and in contact with the molding layer 140, may include a portion contacting the upper surface of the buffer die BD.

In some embodiments, the semiconductor package 10 may include the molding layer 140 surrounding the core die stack CDS. The molding layer 140 may surround the core die stack CDS and the NCF 130 that bonds the plurality of core dies CDs. The molding layer 140 may mold the core die stack CDS and the buffer die BD together. The molding layer 140 may include, for example, an epoxy mold compound (EMC).

Figure 3A:
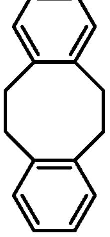
FIGS. 3A and 3B are diagrams for explaining some components of a semiconductor package according to some embodiments of the present disclosure.
Figure 3B:
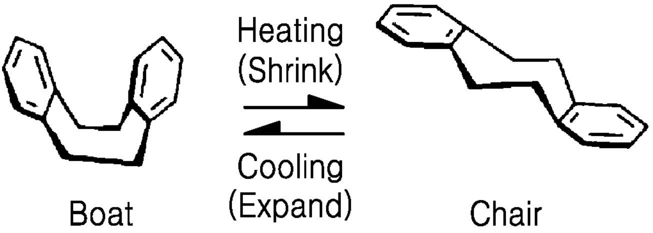
Figure 4:
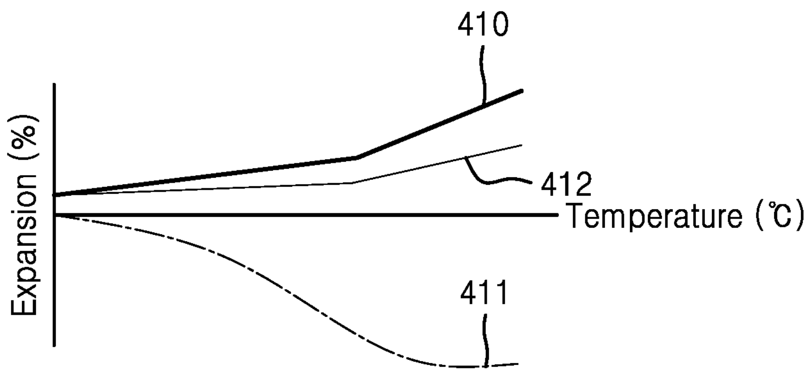
FIG. 4 is a graph for explaining some components of a semiconductor package according to some embodiments of the present disclosure.

FIGS. 3A and 3B are diagrams for explaining some components of a semiconductor package according to some embodiments of the present disclosure. FIG. 4 is a graph for explaining some components of a semiconductor package according to some embodiments of the present disclosure.

FIG. 3A is a chemical structure of DBCOD, and FIG. 3B is a diagram for explaining a volume change of DBCOD. Referring to FIGS. 3A and 3B together, when heat is applied to DBCOD, a volume of DBCOD may be reduced by changing its three-dimensional structure. For example, when heat is applied to DBCOD, the three-dimensional structure of DBCOD may be changed from a boat to a chair. When DBCOD is cooled in a state with reduced volume which was obtained by applying heat to DBCOD, the three-dimensional structure of DBCOD may change again and the volume of DBCOD may increase. For example, if DBCOD having a chair structure is cooled, the DBCOD may change to a boat structure. That is, the volume decrease/increase according to heating/cooling of DBCOD may be reversible. The volume of DBCOD may decrease when heated.

Referring to FIG. 4, the NCF may have a positive coefficient of thermal expansion. In particular, the NCF 131 (refer to FIG. 5D) that does not include DBCOD as a component may have a positive coefficient of thermal expansion. Line 410 may represent the coefficient of thermal expansion according to the temperature of the NCF 131 (see FIG. 5D) that does not include DBCOD as a component. That is, the NCF 131 (refer to FIG. 5D) that does not include DBCOD as a component may have a property of its volume increasing when heat is applied. Specifically, the coefficient of thermal expansion of the NCF 131 (refer to FIG. 5D) that does not include DBCOD as a component may be about 40 ppm/° C. at a temperature below the glass transition temperature of the NCF 131, and may be about 130 ppm/° C. at a temperature above the glass transition temperature of the NCF 131.

On the other hand, DBCOD may have a negative coefficient of thermal expansion. Line 411 of FIG. 4 represents the coefficient of thermal expansion according to the temperature of DBCOD. That is, DBCOD may have a property of its volume reducing when heat is applied.

Line 412 of FIG. 4 shows a coefficient of thermal expansion according to the temperature of the NCF 130 including DBCOD as a component. Comparing to the NCF 131 that does not include DBCOD as a component has a positive coefficient of thermal expansion, the NCF 130 including DBCOD as a component may have a coefficient of thermal expansion that is less than that of the NCF 131 that does not include DBCOD as a component, because DBCOD has a negative coefficient of thermal expansion. That is, the coefficient of thermal expansion of the NCF 130 including DBCOD may be less than that of other NCFs 131 including the same components except for DBCOD. For example, the NCF 130 including DBCOD may have a coefficient of thermal expansion of 40 ppm/° C. or less at a temperature below the glass transition temperature of the NCF 130. For example, the NCF 130 including DBCOD may have a coefficient of thermal expansion of 130 ppm/° C. or less at a temperature higher than the glass transition temperature of the NCF 130.

In some embodiments, a difference between the coefficient of thermal expansion of the NCF 130 including DBCOD and the coefficient of thermal expansion of other components in contact with the NCF 130 may be reduced. Specifically, when the molding layer 140 has a coefficient of thermal expansion that is less than that of the NCF 130, the coefficient of thermal expansion of the NCF 130 may be greater than or equal to the coefficient of thermal expansion of the molding layer 140 and less than or equal to 40 ppm/° C. at a temperature below the glass transition temperature of the NCF 130. The coefficient of thermal expansion of the NCF 130 may be greater than or equal to the coefficient of thermal expansion of the molding layer 140 and less than or equal to 130 ppm/° C. at a temperature greater than the glass transition temperature of the NCF 130. For example, the coefficient of thermal expansion of the NCF 130 may be 10 ppm/° C. or more and 40 ppm/° C. or less at a temperature below the glass transition temperature of the NCF 130, or 30 ppm/° C. or more and 130 ppm/° C. or less at a temperature higher than the glass transition temperature of the NCF 130. Specifically, when the buffer die BD has a coefficient of thermal expansion that is less than the coefficient of thermal expansion of the NCF 130, the coefficient of thermal expansion of the NCF 130 may be greater than or equal to the coefficient of thermal expansion of the buffer die BD and less than or equal to 40 ppm/° C. at a temperature below the glass transition temperature of the NCF 130. The coefficient of thermal expansion of the NCF 130 may be greater than or equal to the coefficient of thermal expansion of the buffer die BD and less than or equal to 130 ppm/° C. at a temperature greater than the glass transition temperature of the NCF 130. For example, the coefficient of thermal expansion of the NCF 130 may be about 3 ppm/° C. or more and 40 ppm/° C. or less at a temperature below the glass transition temperature of the NCF 130, and 3 ppm/° C. or more and 130 ppm/° C. or less at a temperature higher than the glass transition temperature of the NCF 130.

Although line 412 of FIG. 4 illustrates a case in which the coefficient of thermal expansion according to the temperature of the NCF 130 including DBCOD as a component is positive, in some other embodiments, the coefficient of thermal expansion of the NCF 130 including DBCOD as a component may be negative. For example, the coefficient of thermal expansion of the NCF 130 including DBCOD as a component may be a negative number having an absolute value that is less than an absolute value of the coefficient of thermal expansion of DBCOD.

FIGS. 5A to 5D and 6A to 6D show a part of a method of manufacturing a semiconductor package according to a comparative example and an embodiment, respectively, in order to explain a semiconductor package according to some embodiments of the present disclosure. FIGS. 5A to 5D are cross-sectional views showing a part of a method of manufacturing a semiconductor package according to a comparative example for comparing with a semiconductor package according to some embodiments of the present disclosure shown in FIGS. 6A to 6D. FIGS. 6A to 6D are cross-sectional views for explaining a part of a method of manufacturing a semiconductor package according to some embodiments of the present disclosure.

Referring to FIGS. 5A to 5D, the buffer die BD and the core die CD disposed on the buffer die BD may be bonded by the NCF 131 disposed between the buffer die BD and the core die CD. In some embodiments, a portion of the NCF 131 that does not include DBCOD or some of the core lower solders 121 may not contact the buffer die BD.

Figure 5A:
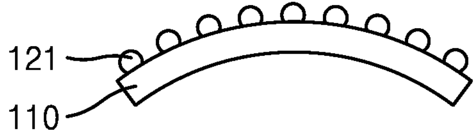
FIGS. 5A to 5D are cross-sectional views showing a part of a method of manufacturing a semiconductor package according to a comparative example for comparing with a semiconductor package according to some embodiments of the present disclosure as shown in FIGS. 6A to 6D.
Figure 5A:
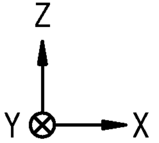

Referring to FIG. 5A, the core lower solder 121 may be disposed on one surface of the core substrate 110. One surface of the core substrate 110 on which the core lower solder 121 is disposed may be a lower surface of the core substrate 110. In some embodiments, the lower surface of the core substrate 110 on which the core lower solder 121 is disposed may face an upward direction (i.e., a +Z direction). In some embodiments, the core substrate 110 may have self-warpage. For example, the self-warpage that may occur in the core substrate 110 may occur vertically, upwardly, and convexly. That is, in the core substrate 110, an area of a surface of the core substrate 110 on which the core lower solder 121 is disposed may increase, and a surface of an area opposite to the surface of the area on which the core lower solder 121 is disposed may bend so that the area thereof decreases.

Figure 5B:
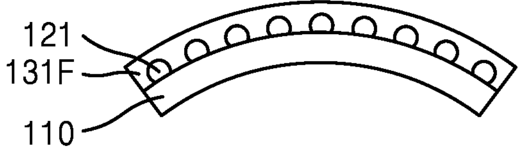
Figure 5B:
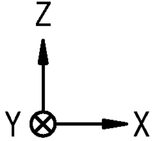

Referring to FIG. 5B, a free NCF 131F surrounding the core lower solder 121 may be disposed on the one surface of the core substrate 110. The free NCF 131F may be disposed to fill gaps between the core lower solders 121. That is, the free NCF 131F may be disposed on a surface having an increased area among both surfaces of the core substrate 110 in which bending occurs. That is, the free NCF 131F may be disposed on a lower surface of the core die CD. The free NCF 131F may refer to an NCF that is disposed on one surface of the core die CD but is not adhered to the buffer die BD. The free NCF 131F may be an NCF that does not include DBCOD. In some embodiments, as warpage occurs in the core substrate 110, warpage may also occur in the free NCF 131F disposed on one surface of the core substrate 110.

Figure 5C:
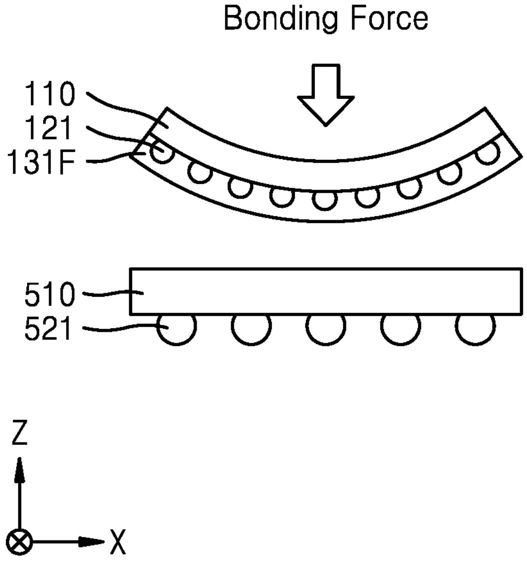

Referring to FIG. 5C, the core die CD may be disposed to be bonded on the buffer die BD. Specifically, the core die CD may be disposed so that a free NCF 131F is disposed in a direction toward the buffer die BD. For example, the core die CD may be turned over so that the free NCF 131F disposed to surround the core lower solder 121 on the one surface of the core substrate 110 faces a downward direction (i.e., a −Z direction). In some embodiments, a bonding force may be applied in a downward direction (the −Z direction) to bond the core die CD onto the buffer die BD. The core die CD and the buffer die BD may be bonded by the NCF 131 by the bonding force. Heat and pressure may be applied to the core die CD and the free NCF 131F by the bonding force.

Figure 5D:
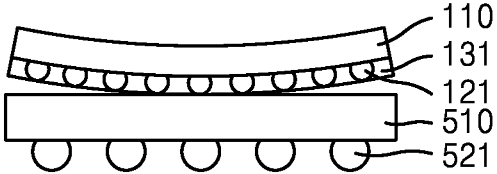
Figure 5D:
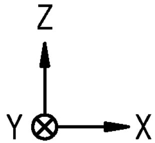

Referring to FIG. 5D, the core die CD may be bonded on the buffer die BD, and the NCF 131 may be disposed between the core die CD and the buffer die BD. As the bonding force is applied, warpage of the core die CD and the NCF 131 may be reduced. In some embodiments, the NCF 131 disposed between the core die CD and the buffer die BD may not completely fill a gap between the core die CD and the buffer die BD even though the bonding force is being applied. For example, there may be still bending in a central portion of the core die CD and the NCF 131 in a direction toward the buffer die BD, and thus, edge portions of the core die CD and the NCF 131 may be separated from an upper surface of the buffer die BD. That is, the NCF 131 that does not include DBCOD may include a portion that does not contact the upper surface of the buffer die BD. For example, an edge portion of the NCF 131 that does not include DBCOD may not contact the upper surface of the buffer die BD. That is, an unfilled region of the NCF 131 may exist between the core die CD and the buffer die BD.

In some embodiments, at least some of the core lower solders 121 may not contact the buffer die BD due to the aforementioned bending of the NCF 131. As described above, the core lower solder 121 is disposed on the buffer upper pad 524 of the buffer die BD so as to be in contact with the buffer upper pad 524 to provide an electrical connection between the core die CD and the buffer die BD, but when the NCF 131 that does not include DBCOD is disposed between the core die CD and the buffer die BD, some of the core lower solders 121 may not be electrically connected to the buffer die BD. For example, at least some of the core lower solders 121 disposed on the edge portion of the NCF 131 among the plurality of core lower solders 121 may not contact the buffer die BD.

On the other hand, according to FIGS. 6A to 6D, the buffer die BD and the core die CD disposed on the buffer die BD may be bonded by the NCF 130 disposed between the buffer die BD and the core die CD.

Figure 6A:
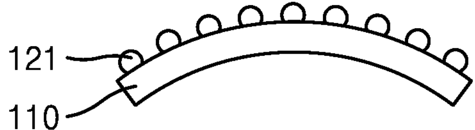
FIGS. 6A to 6D are cross-sectional views for explaining a part of a method of a manufacturing a semiconductor package according to some embodiments of the present disclosure.
Figure 6A:
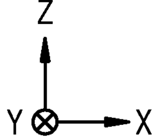

Referring to FIG. 6A, similar to FIG. 5A, the core lower solders 121 may be disposed on one surface of the core substrate 110. The one surface of the core substrate 110 on which the core lower solders 121 are disposed may be a lower surface of the core substrate 110. In some embodiments, the core substrate 110 may have self-warpage.

Figure 6B:
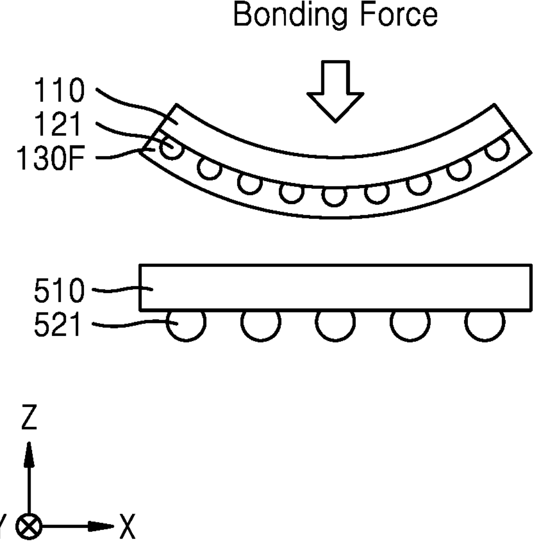

Referring to FIG. 6B, a free NCF 130F surrounding the core lower solder 121 may be disposed on one surface of the core substrate 110. The free NCF 130F may be disposed to fill gaps between the core lower solders 121. That is, the free NCF 130F may be disposed on a surface of the core substrate 110 having an increased area among both surfaces of the core substrate 110 in which the self-bending occurs. That is, the free NCF 130F may be disposed on a lower surface of the core die CD. The free NCF 130F may be an NCF including DBCOD. In some embodiments, as self-warpage occurs in the core substrate 110, self-warpage may also occur in the free NCF 130F disposed on the one surface of the core substrate 110.

Figure 6C:
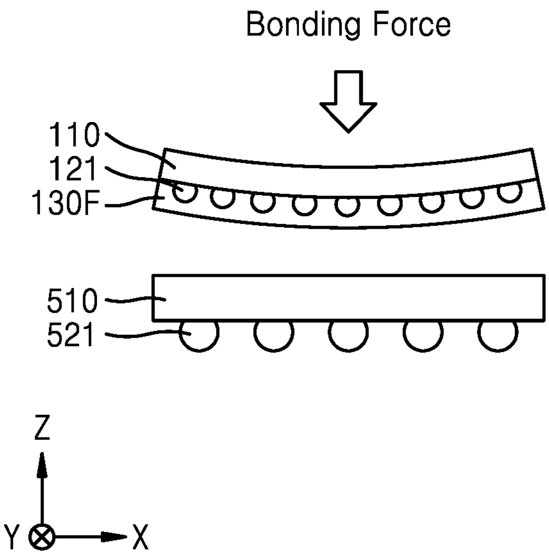

Referring to FIG. 6C, the core die CD may be disposed to be bonded on the buffer die BD. Specifically, the core die CD may be disposed in a direction so that the free NCF 130F faces the buffer die BD. In some embodiments, a bonding force may be applied in a vertical downward direction (−Z direction) to bond the core die CD onto the buffer die BD. The core die CD and the buffer die BD may be bonded by the NCF by the bonding force. Heat and pressure may be applied to the core die CD and the free NCF 130F by the bonding force.

Figure 6D:
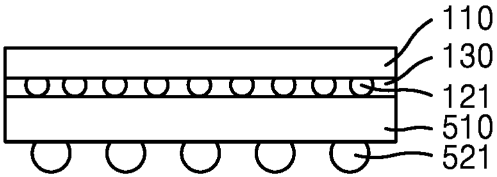
Figure 6D:
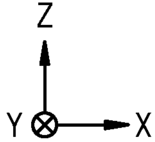

Referring to FIG. 6D, the core die CD may be bonded on the buffer die BD, and the NCF 130 may be disposed between the core die CD and the buffer die BD. As the bonding force is applied, warpage of the core die CD and the NCF 130 may be reduced. In some embodiments, the NCF 130 may fill between the core die CD and the buffer die BD. For example, a central portion and an edge portion of the NCF 130 may contact the upper surface of the buffer die BD. That is, the NCF 130 including DBCOD may include a portion in contact with the upper surface of the buffer die BD. Unlike the edge portion of the NCF 131 described with reference to FIGS. 5A to 5D that does not include DBCOD and may not contact the upper surface of the buffer die BD, an edge portion of the NCF 130 including the DBCOD may contact the upper surface of the buffer die BD.

In some other embodiments, the NCF 130 including DBCOD may include a portion that does not contact the upper surface of the buffer die BD. Specifically, the edge portion of the NCF 130 including DBCOD may include a portion that does not contact the upper surface of the buffer die BD. That is, a region where the NCF 130 is not filled may exist between the core die CD and the buffer die BD. Even when the NCF 130 including DBCOD includes a portion not in contact with the upper surface of the buffer die BD, compared to a case in which the NCF 131 that does not include DBCOD includes a portion not in contact with the upper surface of the buffer die BD, an area of non-contact portion may be reduced. The NCF 131 for comparing whether the non-contact portion is reduced or not may include the same components as the NCF 130 except that DBCOD is not included. That is, the degree of unfilling of the NCF 130 including DBCOD between the core die CD and the buffer die BD may be less than the degree of unfilling of the NCF 131 not including the DBCOD between the core die CD and the buffer die BD.

In some embodiments, the core lower solder 121 may contact the buffer die BD. Unlike some of the core lower solders 121 that may not be electrically connected to the buffer die BD due to bending of the NCF 131 that does not include DBCOD described with reference to FIGS. 5A to 5D, when the NCF 130 including DBCOD is disposed between the core lower solder 121 and the buffer die BD, the core lower solder 121 may be electrically connected to the buffer die BD. For example, some of the core lower solders 121 disposed at the edge of the NCF 130 among the plurality of core lower solders 121 may contact the buffer die BD.

In some other embodiments, even when the NCF 130 including DBCOD is disposed, some of the lower core solders 121 may not contact the buffer die BD. When a portion of an edge portion of the NCF 130 including DBCOD does not come into contact with the upper surface of the buffer die BD, some of the core lower solders 121 surrounded by the NCF 130 may not contact the upper surface of the buffer die BD. Even if some of the core lower solders 121 do not contact the buffer die BD when the NCF 130 including DBCOD is disposed, the number of non-contact lower core solders 121 may be reduced compared to a case when some of the lower core solders 121 do not contact the buffer die BD when the NCF 131 that does not include DBCOD is disposed. The NCF 131 for comparing whether the non-contact portion is reduced or not may include the same components as the NCF 130 except that DBCOD is not included. That is, the contact of the lower core solder 121 between the core die CD and the buffer die BD may be improved by the NCF 130 including DBCOD.

Figure 7A:
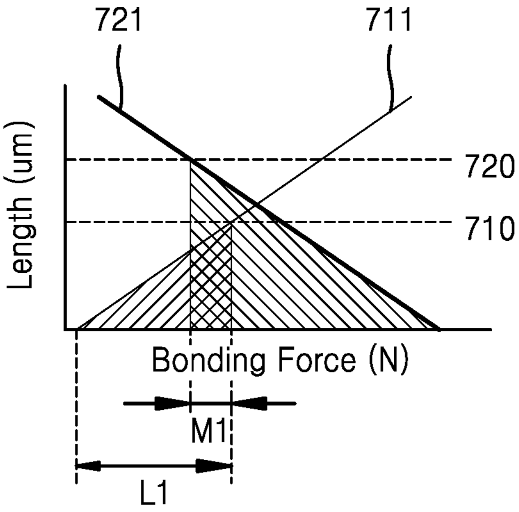
FIGS. 7A and 7B are graphs showing cases of a comparative example and an embodiment, respectively, in order to explain semiconductor packages according to some embodiments of the present disclosure.
Figure 7B:
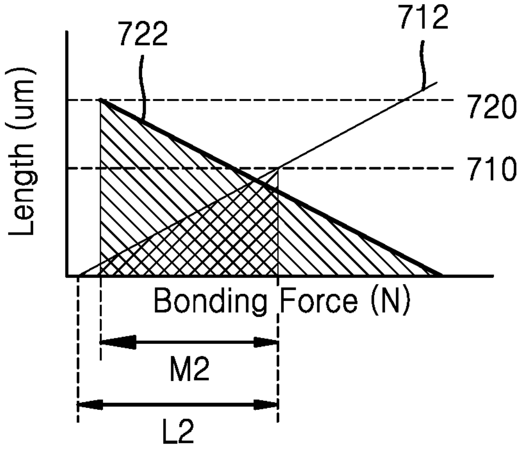

FIGS. 7A and 7B are graphs showing cases of a comparative example and an embodiment, respectively, in order to explain semiconductor packages according to some embodiments of the present disclosure.

Referring to FIG. 7A, lines for the NCF 131 unfilled 721 and the NCF 131 fillet 711 according to a bonding force of the comparative example are shown. In the present specification, the NCF fillet may mean an overflowing portion of the NCF in a space between the buffer die BD and the core die CD and between the core dies CD by the bonding force for bonding the buffer die BD to the core die CD. As shown in FIG. 7A, the non-filling 721 of the NCF 131 may decrease as the bonding force increases, whereas the fillet 711 of the NCF 131 may increase as the bonding force increases. The NCF 131 unfilled 721 and the NCF 131 fillet 711 may have a trade-off relationship. That is, when the bonding force is increased to reduce the NCF 131 non-filling 721, the NCF 131 fillet 711 increases, and when the bonding force is reduced to decrease the NCF 131 fillet 711, the non-filling 721 of the NCF 131 increases.

In the comparative example of FIG. 7A, when both conditions that the NCF 131 unfilled 721 is less than an allowable maximum unfilled 720 and the condition that the NCF 131 fillet 711 is less than the allowable maximum fillet 710 are satisfied, a semiconductor package may be provided, and in the case of the comparative example, the process margin is equal to M1.

Referring to FIG. 7B, lines for the NCF 130 unfilled 722 and the NCF 130 fillet 712 according to the bonding force according to an embodiment are shown. As in the case of FIG. 7A, the non-filling 722 of the NCF 130 may decrease as the bonding force increases, whereas the fillet 712 of the NCF 130 may increase as the bonding force increases. An absolute value of a slope of the line of the NCF 130 unfilled 722 according to an embodiment shown in FIG. 7B may be less than that of the line of the NCF 131 unfilled 721 according to the comparative example shown in FIG. 7A. That is, a range L2 of the bonding force in the case of having the NCF 130 unfilled 722 less than the allowable maximum unfilled 720 may be increased compared to a range L1 of the case of the comparative example shown in FIG. 7A.

In FIG. 7B, when both conditions that the NCF 130 unfilled 722 is less than allowable maximum unfilled 720 and the NCF 130 fillet 712 is less than allowable maximum fillet 710 are satisfied, a semiconductor package may be provided, and in the case of an embodiment, the process margin is equal to M2. M2 may be an increase from the process margin M1 of the comparative example.

A semiconductor package having improved performance and reliability may be provided according to the technical aspect of the present disclosure described with reference to FIGS. 1 to 7B. For example, a semiconductor package in which NCF non-filling between the core die stack CDS and the buffer die BD is improved by the NCF 130 including DBCOD may be provided. For example, a semiconductor package in which an excessive NCF fillet phenomenon is improved by the NCF 130 including DBCOD may be provided. For example, a semiconductor package in which the contact of the lower core solder 121 is improved by the NCF 130 including DBCOD may be provided. For example, a semiconductor package having a process margin improved by the NCF 130 including DBCOD may be provided.

Figure 8:
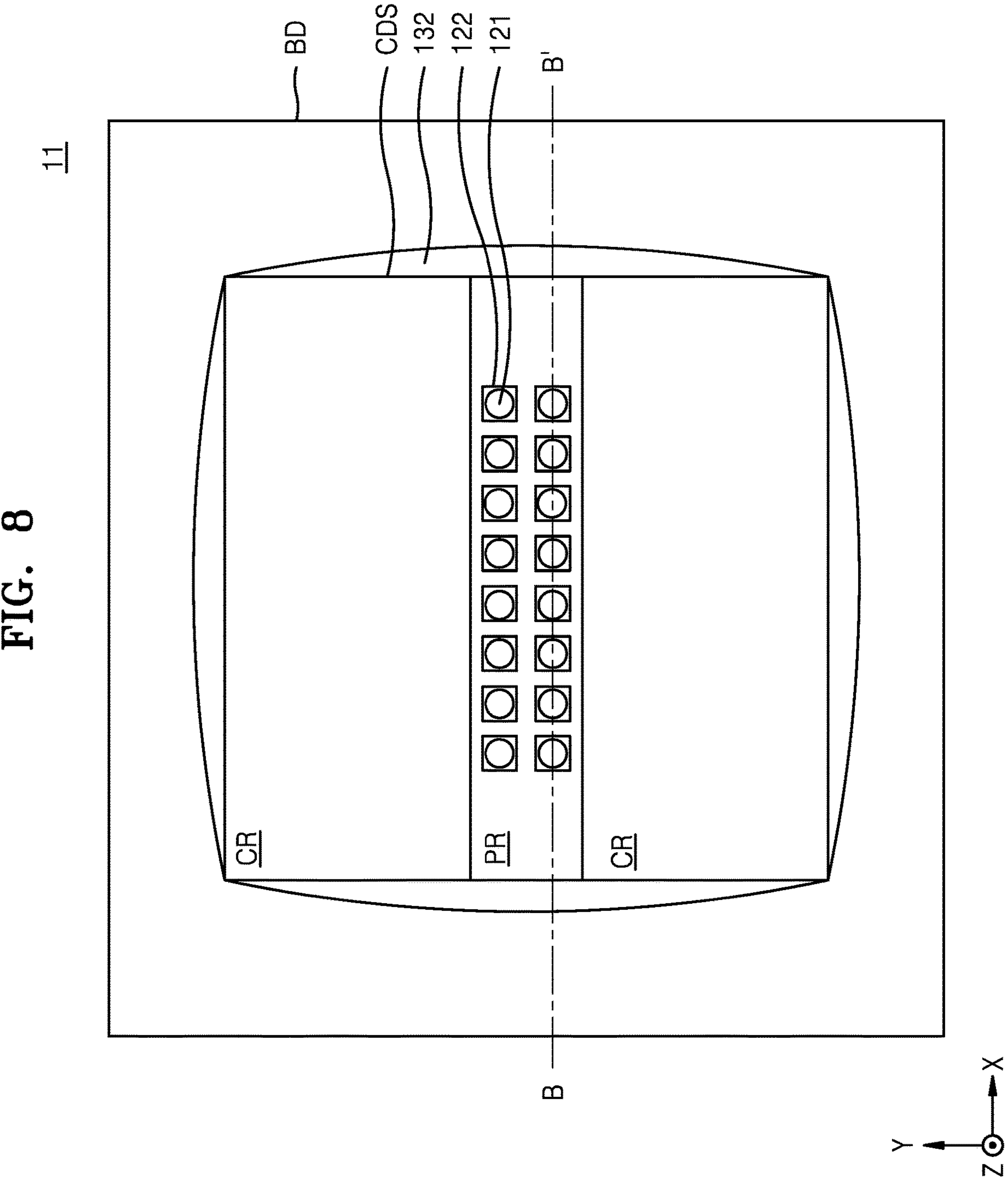
FIG. 8 is a layout diagram illustrating a semiconductor package according to some embodiments of the present disclosure.
Figure 9A:
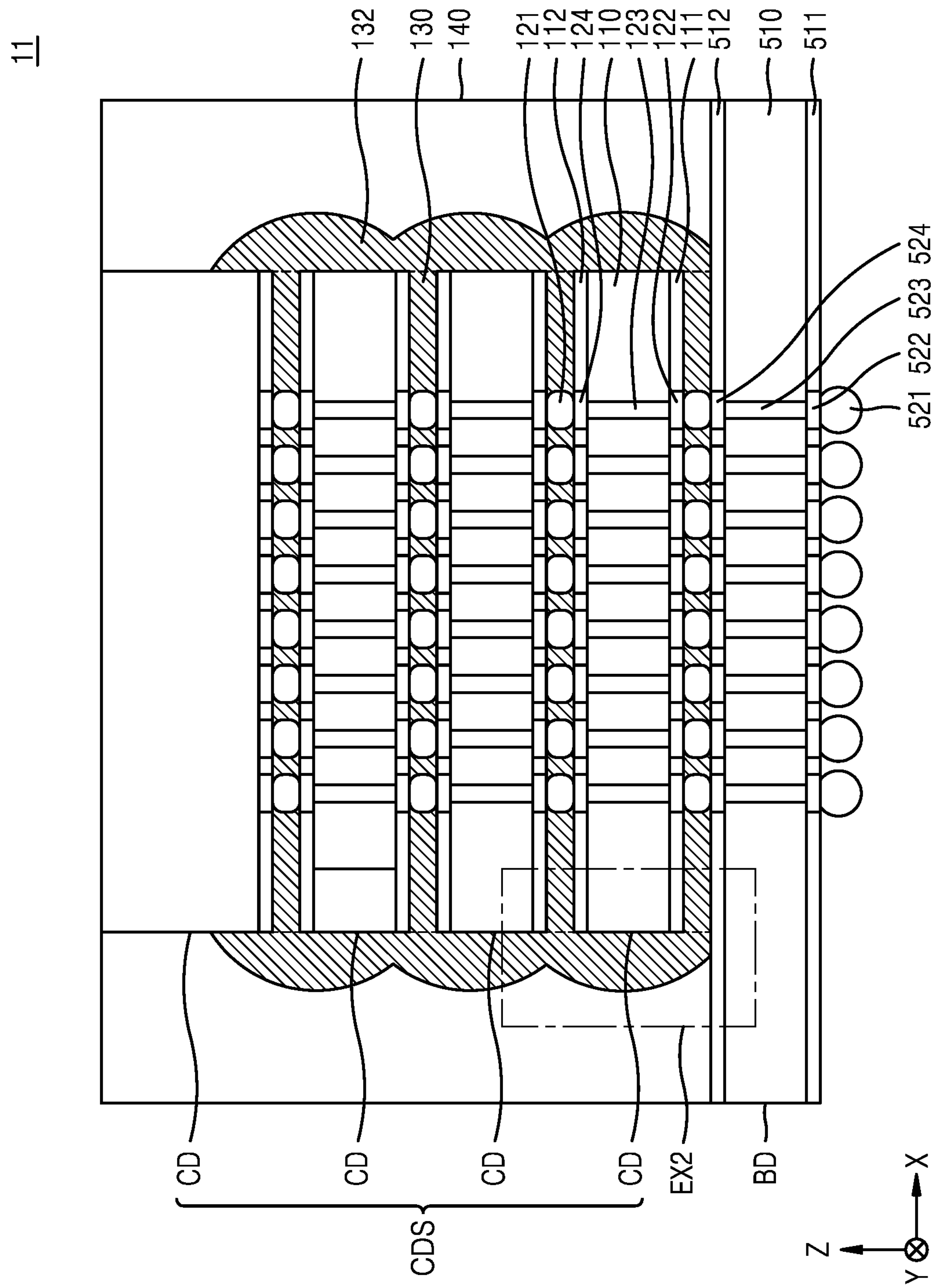
FIG. 9A is a cross-sectional view taken along line B-B' of FIG. 8.
Figure 9B:
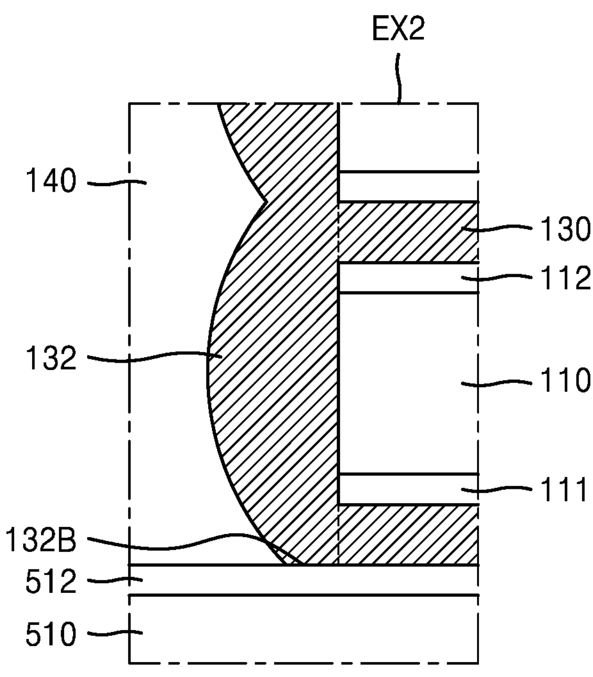
FIG. 9B is an enlarged cross-sectional view of a part EX2 of FIG. 9A.

FIG. 8 is a layout diagram illustrating a semiconductor package 11 according to some embodiments of the present disclosure. FIG. 9A is a cross-sectional view taken along line B-B' of FIG. 8. FIG. 9B is an enlarged cross-sectional view illustrating part EX2 of FIG. 9A.

Referring to FIGS. 8, 9A, and 9B, the semiconductor package 11 may include a buffer die BD, a core die stack CDS, NCFs 130 and 132, and a molding layer 140. The semiconductor package 11 illustrated in FIGS. 8, 9A, and 9B may be similar to the semiconductor package 10 shown in FIGS. 1, 2A, and 2B except that the semiconductor package 11 further includes an NCF 132.

In some embodiments, the semiconductor package 11 may further include an NCF 132 surrounding side surfaces of the core die stack CDS so that the buffer die BD and the core die stack CDS are bonded to each other. For example, the NCF 132 surrounding sides of the core die CD may further be included. In some embodiments, the NCF 132 surrounding the sides of the core die CD may be an NCF fillet.

As depicted in FIGS. 9A and 9B, the NCF 132 may include a portion that contacts an upper surface of the buffer die BD. In some embodiments, the NCF 132 having a reduced unfilled area may include a portion that contacts the upper surface of the buffer die BD. That is, a lower surface 132B of the NCF 132 may contact the buffer die BD. In the case of a semiconductor package in which the NCF 132 including DBCOD is disposed, a difference between the coefficient of thermal expansion of the NCF 132 and the coefficient of thermal expansion of the molding layer 140 and the buffer die BD in contact with the NCF 132 may be reduced. Accordingly, the possibility that peeling occurs at an interface between the molding layer 140 and the buffer die BD may be reduced.

Figure 10:
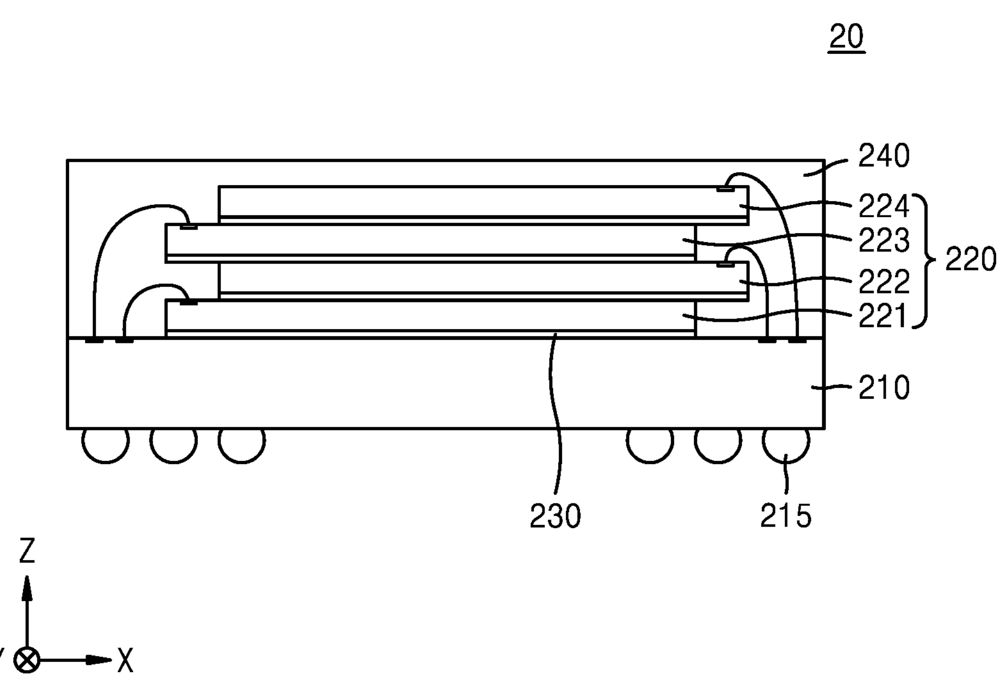
FIG. 10 is a cross-sectional view illustrating semiconductor packages according to some embodiments of the present disclosure.

FIG. 10 is a cross-sectional view illustrating a semiconductor package 20 according to some embodiments of the present disclosure.

Referring to FIG. 10, the semiconductor package 20 may include a package substrate 210, a stacked structure 220, an adhesive layer 230, a molding layer 240, and an external solder 215.

In some embodiments, the external solder 215 may be disposed on a lower surface of the package substrate 210. The external solder 215 may include bumps and/or solder balls. The external solder 215 may function to mount the semiconductor package 20 on an external system substrate or main board. The external solder 215 may include multiple layers or a single layer. For example, when the external solder 215 includes multiple layers, the external solder 215 may include a copper pillar and a solder. When the external solder 215 includes a single layer, the external solder 215 may include tin-silver solder or copper.

In some embodiments, the stacked structure 220 may include sequentially stacked first to fourth semiconductor dies 221, 222, 223, and 224. In some embodiments, each of the first to fourth semiconductor dies 221, 222, 223, and 224 may be adhered to and stacked on the package substrate 210 or a corresponding semiconductor die underneath through the adhesive layer 230. The adhesive layer 230 may be, for example, a die attach film (DAF). However, the material of the adhesive layer 230 is not limited to the DAF. In some embodiments, when the adhesive layer 230 includes a DAF, the DAF may include a DBCOD-based compound. Meanwhile, the stacked structure 220 may have various shapes according to stacked structures of the first to fourth semiconductor dies 221, 222, 223, and 224. In FIG. 10, although the first to fourth semiconductor dies 221, 222, 223, and 224 are illustrated as being connected to the package substrate 210 through bonding wires, this is an example, and the connection between the semiconductor dies 221, 222, 223, and 224 and the package substrate 210 is not limited thereto.

In some embodiments, the molding layer 240 may cover and seal the stacked structure 220 on the package substrate 210. The molding layer 240 may seal the stacked structure 220 to protect the stacked structure 220 from external physical and chemical damage. The molding layer 240 may include, for example, an epoxy-based material, a thermosetting material, a thermoplastic material, a UV curable material, or the like. In addition, the molding layer 240 may include a resin, and may include a filler. As shown in FIG. 10, the molding layer 240 may have a structure covering an upper surface of the stacked structure 220. However, the present disclosure is not limited thereto, and the molding layer 240 may have a structure that does not cover the upper surface of the stacked structure 220. For example, an upper surface of the fourth semiconductor die 224 may be exposed from the molding layer 240.

In the semiconductor package 20 according to some embodiments, the number of semiconductor dies constituting the stacked structure 220 is not limited to four. For example, the stacked structure 220 may include 1 to 3 or 5 or more semiconductor dies.

Figure 11:
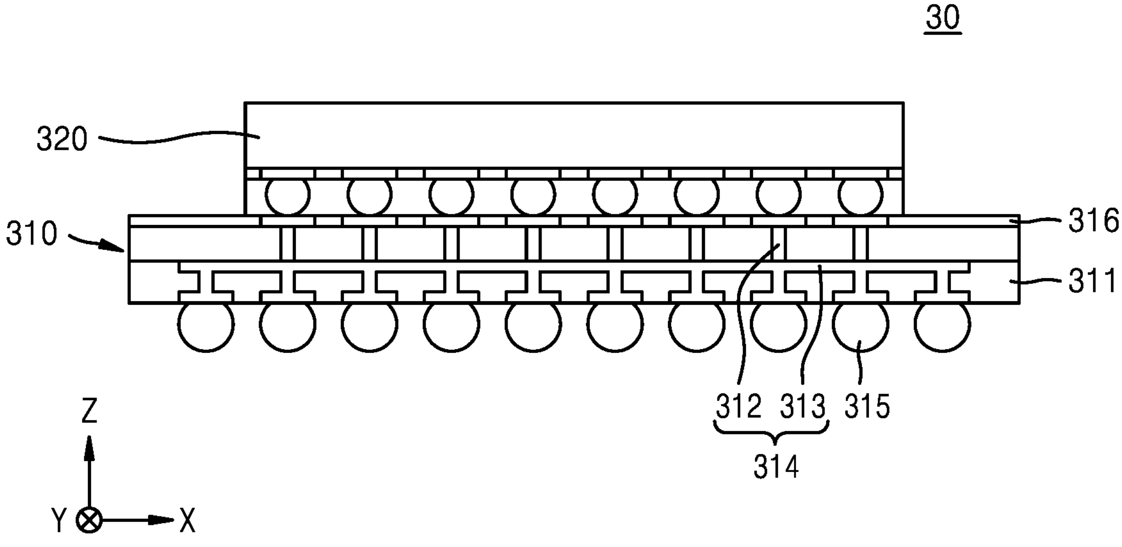
FIG. 11 is a cross-sectional view illustrating semiconductor packages according to some embodiments of the present disclosure.

FIG. 11 is a cross-sectional view illustrating a semiconductor package 30 according to some embodiments of the present disclosure.

Referring to FIG. 11, the semiconductor package 30 may include a substrate 310 and a semiconductor die 320, and the substrate 310 may include a plurality of redistribution insulating layer 311 and a plurality of redistribution patterns 314. The plurality of redistribution patterns 314 may include a plurality of redistribution line patterns 313 and a plurality of redistribution vias 312.

In some embodiments, the substrate 310 may include a plurality of stacked redistribution insulating layers 311. The redistribution insulating layer 311 may include, for example, a photo imageable dielectric (PID) or a photosensitive polyimide (PSPI). The redistribution insulating layer 311 may include, for example, Ajinomoto buildup film (ABF). In some embodiments, when the redistribution insulating layer 311 includes the PID and/or the ABF, the PID and/or the ABF may include a DBCOD-based compound.

The plurality of redistribution patterns 314 including the plurality of redistribution line patterns 313 and the plurality of redistribution vias 312 may include a metal, for example, copper (Cu), aluminum (Al), tungsten (W), titanium. (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but is not limited thereto. In some embodiments, the plurality of redistribution patterns 314 may be formed by stacking a metal or an alloy of a metal on a seed layer including titanium, titanium nitride, or titanium tungsten.

The plurality of redistribution line patterns 313 may be disposed on at least one of an upper surface and a lower surface of the redistribution insulating layer 311. The plurality of redistribution vias 312 may pass through at least one redistribution insulating layer 311 to be in contact with and connected to a portion of the plurality of redistribution line patterns 313. In some embodiments, at least some of the plurality of redistribution line patterns 313 may be formed together with some of the plurality of redistribution vias 312 to form one body. For example, the redistribution line patterns 313 and the redistribution vias 312 in contact with an upper surface of the redistribution line patterns 313 may form one body.

In some embodiments, the plurality of redistribution vias 312 may have a tapered shape in which a horizontal width narrows from a lower side thereof towards an upper side thereof. That is, the horizontal width of the plurality of redistribution vias 312 may be increased as it moves away from the semiconductor die 320.

Among the plurality of redistribution line patterns 313, some of the redistribution line patterns 313 disposed on an upper surface of the substrate 310 may be referred to as redistribution upper surface pads, and some of the redistribution line patterns 313 disposed on a lower surface of the substrate 310 may be referred to as redistribution lower surface pads. A front connection pad 316 may be connected to the redistribution upper surface pad, and package connection terminal 315 may be attached to the redistribution lower surface pad. Each package connection terminal 315 may function as an external connection terminal of the semiconductor package 30. The package connection terminal 315 may connect the semiconductor package 30 to the outside. In some embodiments, each package connection terminal 315 may be a bump, a solder ball, or the like.

Figure 12:
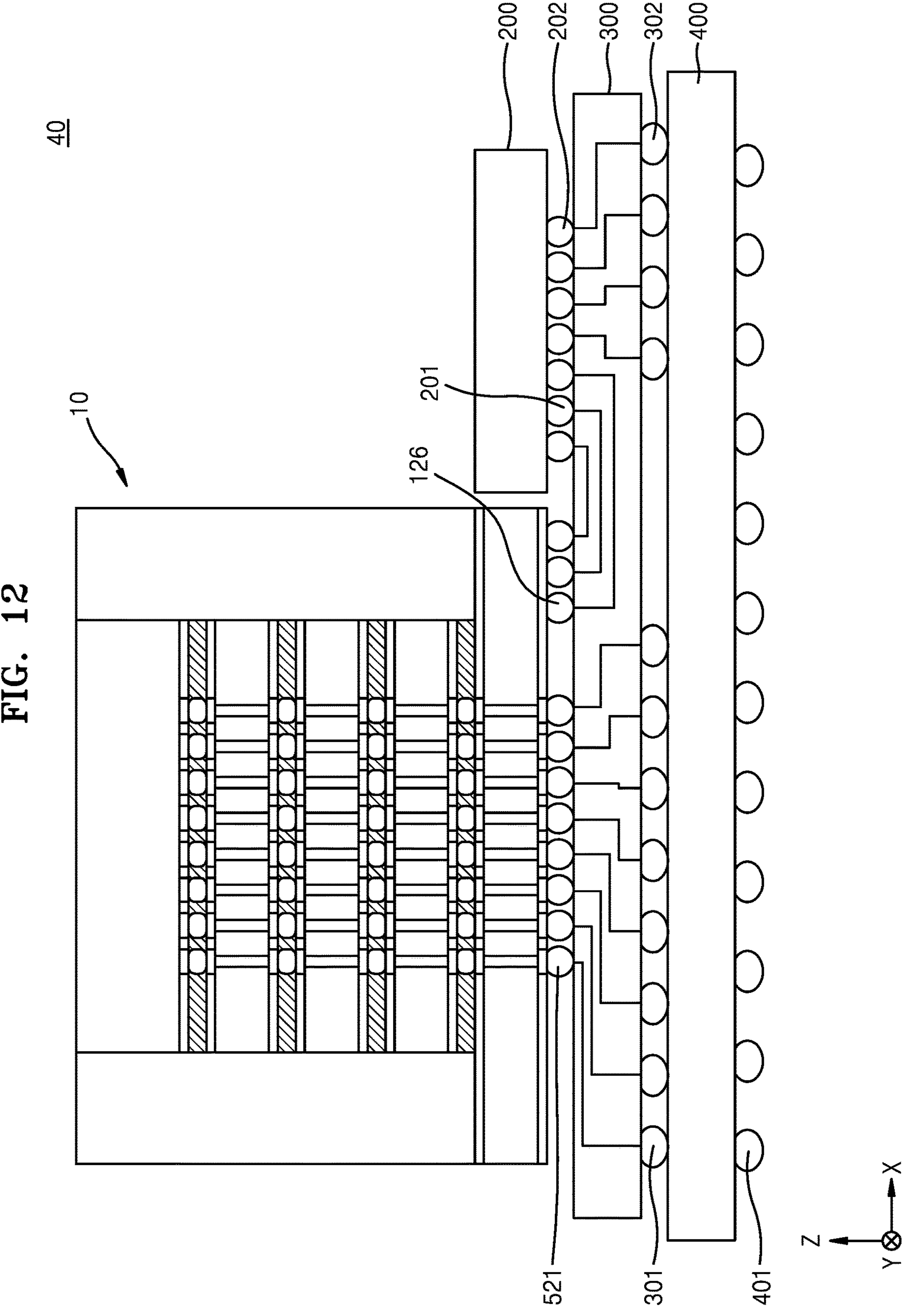
FIG. 12 is a cross-sectional view illustrating semiconductor packages according to some embodiments of the present disclosure.

FIG. 12 is a cross-sectional view illustrating a semiconductor package 40 according to some embodiments of the present disclosure.

The semiconductor package 10 which is part of the semiconductor package 40 may be substantially the same as the semiconductor package 10 described with reference to FIGS. 1 to 7B.

The semiconductor package 10 may be electrically connected to an interposer 300 by the buffer lower solder 521. An electrical signal of the semiconductor package 10 may be transmitted to a package substrate 400 through wiring formed in the interposer 300. The electrical signal of the semiconductor package 10 may be fanned out by the interposer 300.

The semiconductor package 10 may be electrically connected to a processor 200 through buffer connection terminals 126. The buffer connection terminals 126 of the semiconductor package 10 may be electrically connected to first processor connection terminals 201 attached to a lower surface of the processor 200. An electrical signal of the semiconductor package 10 may be transmitted to the processor 200 through wirings formed in the interposer 300.

The processor 200 may be electrically connected to the interposer 300 by a second processor connection terminal 202. An electrical signal of the processor 200 may be transmitted to a package substrate 400 through the wirings formed in the interposer 300.

The processor 200 may include a device for controlling and regulating the semiconductor package 10. The processor 200 may include a CPU, a graphics processing unit (GPU), and an SOC die.

The interposer 300 may include a substrate base including a semiconductor material and upper and lower pads respectively formed on upper and lower surfaces of the substrate base. The substrate base may be formed from, for example, a silicon wafer. In addition, internal wirings may be formed on the upper surface, the lower surface, or an inside of the substrate base. In addition, through vias electrically connecting the upper pads and the lower pads may be formed in the substrate base.

A first interposer connection terminal 301 and a second interposer connection terminal 302 may be attached to a lower surface of the interposer 300. The first interposer connection terminal 301 and the second interposer connection terminal 302 may be attached to, for example, the lower pads. The first interposer connection terminal 301 and the second interposer connection terminal 302 may be, for example, solder balls or bumps. The first interposer connection terminal 301 may be a connection terminal for electrically connecting the semiconductor package 10 and the package substrate 400. The second interposer connection terminal 302 may be a connection terminal for electrically connecting the processor 200 and the package substrate 400.

The package substrate 400 may be, for example, a printed circuit board or a ceramic substrate. When the package substrate 400 is a printed circuit board, the package substrate 400 may include a substrate base, and the upper and lower pads respectively formed on upper and lower surfaces thereof. The upper pads and the lower pads may be exposed by a solder resist layer covering the upper and lower surfaces of the substrate base, respectively. The substrate base may include at least one material selected from a phenol resin, an epoxy resin, and a polyimide. For example, the substrate base may include at least one material selected from FR4, tetrafunctional epoxy, polyphenylene ether, epoxy/polyphenylene oxide, bismaleimide triazine (BT), thermount, cyanate ester, polyimide, and liquid crystal polymer. The upper and lower pads may include copper, nickel, stainless steel, or beryllium copper. The internal wirings electrically connecting the upper pads and the lower pads may be formed in the substrate base. The upper pads and the lower pads may be portions exposed by the solder resist layer among circuit wirings patterned after coating a copper foil on the upper and lower surfaces of the substrate base.

An external connection terminal 401 may be attached to a lower surface of the package substrate 400. The external connection terminal 401 may be attached to, for example, the lower pads. The external connection terminal 401 may be, for example, solder balls or bumps. The external connection terminal 401 may electrically connect the semiconductor package 40 and an external device. For example, the external connection terminal 401 may include UBM patterns disposed on the lower pads and solder balls disposed on the UBM patterns. The external connection terminal 401 may further include external connection pillars disposed between the UBM patterns and the solder balls. The external connection pillars may include, for example, copper.

While the present disclosure has been particularly shown and described with reference to embodiments thereof, it will be understood that various changes in form and details may be made therein without departing from the spirit and scope of the following claims.

What is claimed is:

1. A semiconductor package comprising:

a buffer die;

a first core die disposed on the buffer die; and a non-conductive film (NCF) disposed between the buffer die and the first core die so that the buffer die and the first core die are bonded to each other, wherein the NCF comprises a dibenzocyclooctadiene (DBCOD)-based compound, and wherein the NCF comprises a flux, and the flux comprises the DBCOD-based compound.

2. The semiconductor package of claim 1, wherein the NCF comprises an epoxy, and the epoxy comprises the DBCOD-based compound in which the DBCOD is chemically bonded to an epoxy group.

3. The semiconductor package of claim 1, wherein a weight ratio of the DBCOD is in a range from about 0.1 wt % to about 10 wt % with respect to a total weight of the flux.

4. The semiconductor package of claim 1, further comprising:

a second core die disposed on the first core die, wherein an NCF which comprises a DBCOD-based compound is disposed between the first core die and the second core die, and comprises a portion bonding the first core die and the second core die to each other.

5. The semiconductor package of claim 1, wherein the NCF comprising the DBCOD has a coefficient of thermal expansion which is:

(i) about 3 ppm/° C. or more and 40 ppm/° C. or less at a temperature below the glass transition temperature of the NCF, and (ii) 3 ppm/° C. or more and 130 ppm/° C. or less at a temperature above the glass transition temperature of the NCF.

6. The semiconductor package of claim 1, wherein the DBCOD-based compound comprises at least one of cis-diaminedibenzocyclooctadiene (Cis-DADBCOD) and trans-diaminedibenzocyclooctadiene (Trans-DADBCOD).

7. The semiconductor package of claim 1, wherein the dibenzocyclooctadiene (DBCOD)-based compound is represented by any one of Chemical Formula A2 and Chemical Formula A4:

<Formula A2>

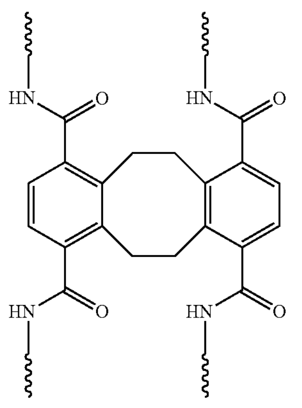

-continued

<Formula A4>

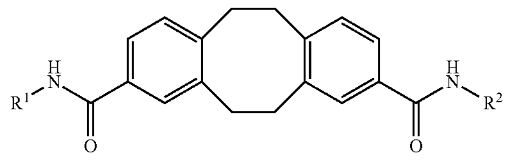

wherein in Formula A4, $R^1$ and $R^2$ are selected from hydrogen, an alkyl group, a carboxyl group, an amine group, an imidazole group, and a phenyl group, or a combination thereof, respectively.

8. The semiconductor package of claim 1, wherein the NCF comprises a hardener, and the hardener comprises the DBCOD-based compound.

9. The semiconductor package of claim 8, wherein a weight ratio of the DBCOD in the hardener is in a range from about 0.1 wt % to about 10 wt % of the hardener.

10. The semiconductor package of claim 1, wherein the NCF comprises a polymer, and the polymer comprises the DBCOD-based compound.

11. The semiconductor package of claim 10, wherein the DBCOD is included in the polymer in a proportion ranging from about 0.1% to about 50% of a molecular weight of the polymer.

12. The semiconductor package of claim 10, wherein a weight ratio of the polymer is in a range from about 1 wt % to about 50 wt % with respect to a total weight of the NCF.

* * * * *